(12) United States Patent
Huang et al.

(10) Patent No.: US 11,373,843 B2
(45) Date of Patent: Jun. 28, 2022

(54) CAPACITIVELY COUPLED PLASMA ETCHING APPARATUS

(71) Applicant: Advanced Micro-Fabrication Equipment Inc. China, Shanghai (CN)

(72) Inventors: Yunwen Huang, Shanghai (CN); Tuqiang Ni, Shanghai (CN); Jie Liang, Shanghai (CN); Jinlong Zhao, Shanghai (CN); Lei Wu, Shanghai (CN)

(73) Assignee: ADVANCED MICRO-FABRICATION EQUIPMENT INC. CHINA, Shanghai (CN)

( * ) Notice: Subject to any disclaimer, the term of this patent is extended or adjusted under 35 U.S.C. 154(b) by 0 days.

(21) Appl. No.: 16/716,357

(22) Filed: Dec. 16, 2019

(65) Prior Publication Data
US 2020/0194230 A1   Jun. 18, 2020

(30) Foreign Application Priority Data
Dec. 17, 2018   (CN) .......................... 201811544972.1

(51) Int. Cl.
*H01J 37/32* (2006.01)
*H01L 21/67* (2006.01)

(52) U.S. Cl.
CPC .. *H01J 37/32091* (2013.01); *H01J 37/32532* (2013.01); *H01L 21/67069* (2013.01)

(58) Field of Classification Search
CPC ........... H01J 37/32082; H01J 37/32091; H01J 37/32532; H01J 37/32568;
(Continued)

(56) References Cited
U.S. PATENT DOCUMENTS 5,210,466 A * 5/1993 Collins ................. C23C 16/509
156/345.44
5,348,497 A * 9/1994 Nitescu ............ H01J 37/32577
411/373
(Continued)

*Primary Examiner* — Benjamin Kendall
(74) *Attorney, Agent, or Firm* — Womble Bond Dickinson (US) LLP; Joseph Bach, Esq.

(57) ABSTRACT

Disclosed is a capacitively coupled plasma etching apparatus, wherein a lower electrode is fixed to a lower end of an electrically conductive supporting rod, a telescope electrically conductive part is fixed to the lower end of the electrically conductive supporting rod, wherein the retractable electrically conductive part being telescoped along an axial direction of the electrically conductive supporting rod; besides, the lower end of the retractable electrically conductive part is electrically connected with the output end of the radio-frequency matcher via an electrically connection portion. In this way, the height of the lower electrode may be controlled through telescoping of the retractable electrically conductive part, such that the spacing between the upper and lower pads becomes adjustable. Besides, an inner electrically conductive ring is further provided at the outer side of the lower electrode; the inner electrically conductive ring is electrically connected with the chamber body via the retractable electrically conductive part; shielding is formed between the inner electrically conductive ring, the lower electrode, and a radio frequency return path in the cavity, avoiding instability of the radio frequency loop caused by the lower electrode radio frequency field during the movement process, thereby achieving stability of the radio-frequency loop while achieving adjustability of the inter-pad spacing.

11 Claims, 1 Drawing Sheet

(58) Field of Classification Search
CPC ......... H01J 37/32577; H01L 21/67069; H01L 21/67248; H01L 21/6831; H01L 21/68742; H01L 21/68792
See application file for complete search history.

(56) References Cited

U.S. PATENT DOCUMENTS

| | | | | |
|---|---|---|---|---|
| 5,772,833 | A * | 6/1998 | Inazawa | H01J 37/32082 156/345.47 |
| 6,673,196 | B1 * | 1/2004 | Oyabu | H01J 37/32477 118/719 |
| 7,186,315 | B2 * | 3/2007 | Himori | H01J 37/32009 118/723 E |
| 2017/0365449 | A1 * | 12/2017 | Cui | C23C 16/505 |

* cited by examiner

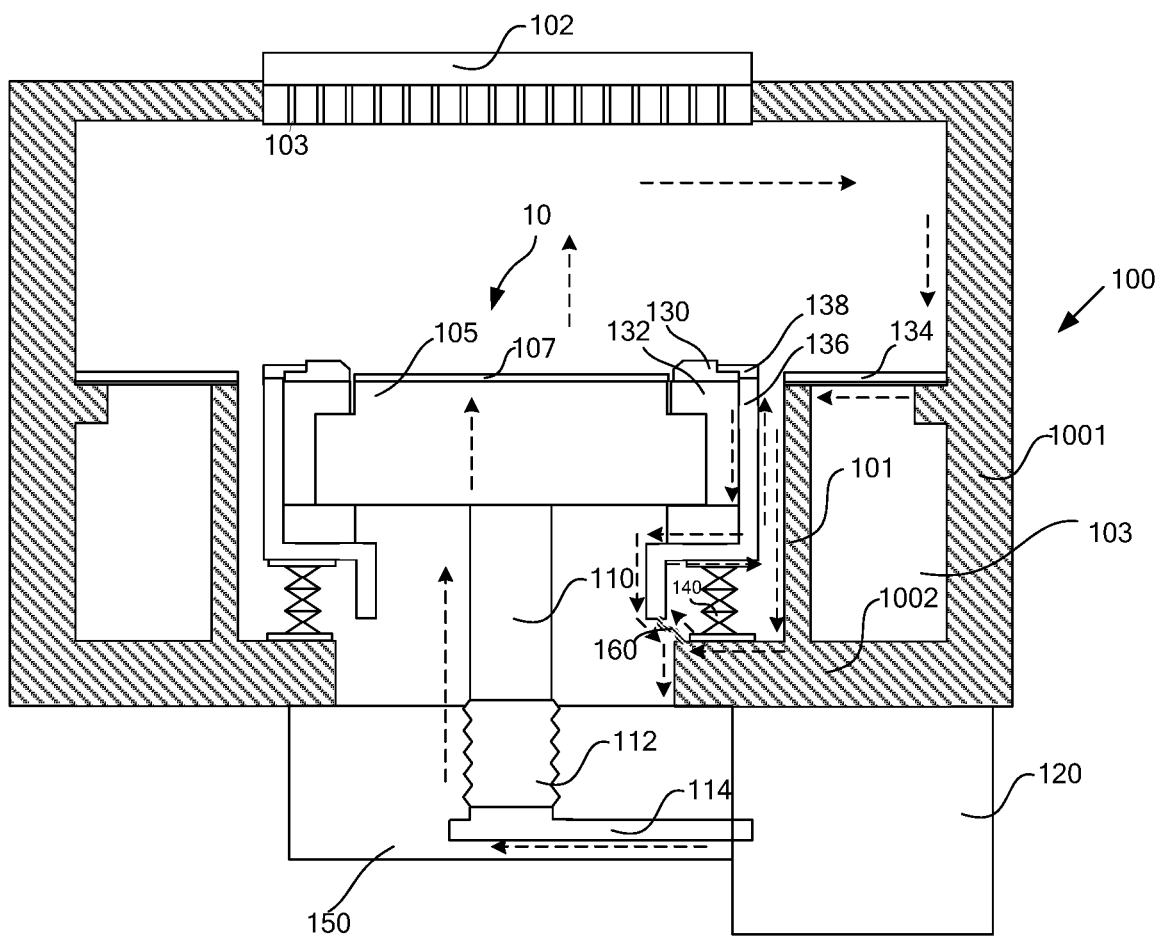

CAPACITIVELY COUPLED PLASMA ETCHING APPARATUS

RELATED APPLICATION

This application claims priority benefit from Chinese Patent Application No. 201811544972.1, filed Dec. 17, 2018, the disclosure of which is hereby incorporated herein by reference in its entirety.

FIELD

The present disclosure relates to semiconductor processing apparatuses, and more particularly relates to a capacitively coupled plasma etching apparatus.

BACKGROUND

A capacitively couple plasma processing apparatus refers to a apparatus which generates plasma by radio frequency coupled discharging and then utilizes the plasma to perform processes such as deposition and etching, wherein the plate distance between plasma-generating electrodes is a critical parameter; particularly, with the ever higher requirements on processes of a plasma etching apparatus, it is needed to implement different etching steps under different plate distances. However, because electrodes are part of the radio frequency loop, movement of the lower electrode will cause instability of the radio frequency signal; therefore, it is needed to achieve adjustability of the plate distance while maintaining stability of the radio-frequency loop.

SUMMARY

In view of the above, an objective of the present disclosure is to provide a capacitively coupled plasma etching apparatus, which may achieve adjustability of plate distances while maintaining radio-frequency loop stability.

To achieve the objective above, the present disclosure provides a technical solution below:

A capacitively coupled plasma etching apparatus comprises:

a chamber body, which includes a side wall and a bottom wall, the bottom wall has an opening;

an upper electrode disposed in the chamber body and a base arranged opposite to the upper electrode, the base comprising a lower electrode, the lower electrode being fixed to an electrically conductive supporting rod and disposed above the opening;

a retractable electrically conductive part fixed to a lower end of the electrically conductive supporting rod, the retractable electrically conductive part being extended or retracted in the axial direction of the electrically conductive supporting rod; and an electrical connection part securely connected between the lower end of the retractable electrically conductive part and an output end of a radio frequency matcher, a loop end of the radio frequency matcher being fixed at the bottom of the chamber body;

the base further comprises a dielectric ring fixed to the outer side of the lower electrode, and an inner electrically conductive ring fixed to the outer side of the dielectric ring;

a radio-frequency return path is provided at the inner side of the chamber body; a gap is provided between the inner electrically conductive ring and the radio frequency return path; the inner electrically conductive ring is fixed to the bottom wall of the chamber body via a retractable sealing part, such that the upper surface of the lower electrode is disposed in an accommodation space where the chamber body is accommodated; and the retractable sealing part is extended or retracted in the axial direction of the electrically conductive supporting rod; and an electrically conductive strip is fixedly connected between the inner electrically conductive ring and the chamber body, the length of the electrically conductive strip being adapted to the movable amount of the retractable sealing part.

Optionally, the capacitively coupled plasma etching apparatus further comprises a grounding ring, the grounding ring being disposed on the bottom wall of the chamber body, a cavity being provided between the grounding ring and the side wall, and the grounding ring being part of the radio frequency return path.

Optionally, the capacitively coupled plasma etching apparatus further comprises a plasma confinement ring disposed above the cavity, the plasma confinement ring and the cavity forming an exhaust cavity; and the plasma confinement ring comprises an electrically conductive part, the electrically conductive part causing the radio frequency current to enter the grounding ring from the side wall of the chamber body through the plasma confinement ring.

Optionally, the electrically conductive strip is fixed to the bottom wall of the chamber body; the radio frequency current from the grounding ring flows through the electrically conductive strip, then sequentially through the outer side and the inner side of the inner electrically conductive ring, and then returns to the loop end from the bottom wall of the chamber body.

Optionally, the retractable electrically conductive part is an electrically conductive bellow, the axis of the electrically conductive bellow overlapping with the axis of the electrically conductive supporting rod.

Optionally, the retractable sealing part is a bellow seal.

Optionally, an electrostatic chuck is disposed on the lower electrode, the dielectric ring surrounding the side wall of the lower electrode, and a focus ring surrounding the electrostatic chuck is further provided on the dielectric ring.

Optionally, the radio frequency matcher is provided in one or plurality, the plurality of radio frequency matchers having different frequencies and powers.

Optionally, one ore more radio frequency shield covers are further provided outside the electrically conductive supporting rod, the retractable electrically conductive part, and the electrical connection part.

Optionally, the electrical connection part comprises a transverse portion in the radial direction of the retractable electrically conductive part, and the transverse part is a rigid connection part.

In the capacitively coupled plasma etching apparatus provided in the embodiments of the present disclosure, the lower electrode is fixed to the lower end of the electrically conductive supporting rod, the retractable electrically conductive part is fixed to the lower end of the electrically conductive supporting rod, wherein the retractable electrically conductive part being extended or retracted in an axial direction of the electrically conductive supporting rod; besides, the lower end of the retractable electrically conductive part is electrically connected with the output end of the radio-frequency matcher via the electrically connection part. In this way, the height of the lower electrode may be controlled by extension or retraction of the retractable electrically conductive part, making the plate distance between the upper and lower plates adjustable. Besides, an inner electrically conductive ring is further provided at the outer side of the lower electrode; the inner electrically conductive ring is electrically connected with the chamber body via the retractable electrically conductive part; shielding is formed between the inner electrically conductive ring and a radio frequency return path in the chamber body, avoiding instability of the radio frequency loop caused by the lower electrode radio frequency field during the movement process, thereby achieving stability of the radio-frequency loop while achieving adjustability of the plate distance.

BRIEF DESCRIPTION OF THE DRAWINGS

To elucidate the technical solutions of the present disclosure or the prior art, the drawings used in describing the embodiments of the present disclosure or the prior art will be briefly introduced below. It is apparent that the drawings as described only relate to some embodiments of the present disclosure. To those skilled in the art, other drawings may be derived based on these drawings without exercise of inventive work, wherein:

FIG. 1 illustrates a sectional structural schematic diagram of a capacitively coupled plasma etching apparatus according to the embodiments of the present disclosure.

DETAILED DESCRIPTION OF EMBODIMENTS

To make the objective, features, and advantages of the present disclosure more clearly and comprehensibly, the preferred embodiments of the present disclosure will be described in detail below with reference to the accompanying drawings.

Many details will be illustrated below to facilitate sufficient understanding of the present disclosure. However, the present disclosure may also adopt other different embodiments to implement. Without departing from the idea of the present disclosure, those skilled in the art may make similar extensions. Therefore, the present disclosure is not limited to the preferred embodiments described below.

FIG. 1 shows a sectional structure schematic diagram of a capacitively coupled plasma etching apparatus according to an embodiment of the present disclosure. The plasma etching apparatus has a processing chamber, wherein the processing chamber is a hermetically sealed space enclosed by a chamber body 100 and other essential components, such that a wafer may completely undergo an etching process in the vacuum environment of the processing chamber.

In the chamber body 100 are disposed an upper electrode 102, and a base 10 arranged opposite to the upper electrode 102; the base 10 comprises a lower electrode 105, the lower electrode 105 being fixed to an electrically conductive supporting rod 110; a lower end of the electrically conductive supporting rod 110 is fixed on a retractable electrically conductive part 112; an electrical connection part 114 is connected between the lower end of the retractable electrically conductive part 112 and an output end of a radio frequency matcher 120; and a loop end of the radio frequency matcher 120 is fixed at the bottom of the chamber body 100.

The upper electrode 102 is an electrode disposed at the upper part of the chamber body 100; the upper electrode 102 is also referred to as a showerhead; an air inlet (not shown) is generally provided on an end face of the upper electrode 102 outside the processing chamber, and a vent hole 103 is generally provided on an end face inside the processing chamber; the process gas enters the upper electrode 102 via the air inlet and is transmitted into the processing chamber via the vent hole 103.

The lower electrode 105 is connected to the output end of the radio-frequency matcher 120 sequentially through the electrically conductive supporting rod 110, the retractable electrically conductive part 112, and the electrical connection part 114; the radio-frequency matcher 120 is connected to the radio-frequency power supply (not shown) so as to supply the radio-frequency power to the lower electrode 105.

In some embodiments, the lower electrode 105 may be connected to one or more radio-frequency matcher 120, e.g., 2 radio-frequency matchers. In an embodiment wherein the lower electrode 105 is connected to a plurality of radio-frequency matchers, each radio-frequency matcher may supply a frequency and power different from those supplied by other radio-frequency matchers so as to be adapted to the requirements of different processes. In such embodiments, the upper electrode 102 may be grounded. In some other embodiments, the lower electrode 105 may be connected to a radio-frequency matcher, and the upper electrode may be connected to another radio-frequency matcher; the two radio-frequency matchers may supply different frequencies and powers.

The lower electrode 105 may further serve as a support structure for the wafer. A temperature control apparatus (not shown) may be disposed in the lower electrode or in a dielectric material layer above the lower electrode, for providing an appropriate temperature to the wafer; the temperature control apparatus may be a joule heat apparatus, e.g., implementing temperature control via resistance; it may also be a heat conduction passage, e.g., implementing temperature control via the coolant in the heat conduction passage; temperature control devices may be arranged by partition, such that the temperatures of different regions of the wafer may be separately controlled, thereby implementing uniform temperature control.

An electrostatic chuck (ESC) 107 may be further provided on the lower electrode 105, for adsorbing the wafer; the electrostatic chuck 107 may be disposed in the dielectric material layer; the dielectric material, for example, may be a ceramic material.

In an embodiment of the present disclosure, the lower electrode 105 is connected to a radio frequency source, serving as a radio-frequency power output end; the upper electrode 102 and the chamber body 100 may be grounded; the chamber body 100, or the chamber body and some other accessories electrically connected to the chamber body, may serve as a return path for the radio-frequency power. Specifically, the radio-frequency power is outputted from the output end of the radio-frequency matcher 120, and after sequentially passing through the electrical connection part 114, the retractable electrically conductive part 112, and the electrically conductive supporting rod 110, enters the lower electrode 105; after the process gas is introduced into the chamber body 100 via the upper electrode 102, in the action of the radio-frequency power, plasma is generated in the space between the upper electrode 102 and the lower electrode 105, i.e., in the space above the lower electrode 105; the radio-frequency power returns, via the plasma, to the loop end of the radio-frequency matcher through the return path in the chamber body 100; dependent on different chamber body structures and different design requirements, the return path may be configured differently.

The radio-frequency matcher 120, which is connected to a radio frequency source, is configured for outputting a desired radio-frequency power; the radio-frequency matcher 120 has an output end and a loop end, wherein the output end is configured for outputting a radio frequency, and the loop end is configured for receiving the returned radio frequency. Particularly, the loop end of the radio-frequency matcher 120 is securely connected to the bottom of the chamber body 100; one end of the electrically connection part 114 is fixed to the output end of the radio-frequency matcher 120, and the other end thereof is fixedly connected to the lower end of the retractable electrically conductive part 112; the electrically conductive part 114 is made of an electrically conductive material, which conveys the radio frequency power outputted from the radio frequency matcher 120 to the retractable electrically conductive part 112 and further conveys the radio frequency power to the lower electrode 105. In this way, the radio frequency matcher 120 is fixedly connected to thereby fix one end of the electrical connection part 114, and the other end thereof only moves with the retractable electrically conductive part 112 in the axial direction of the electrically conductive support part 110; the axial movement has little impact on radio-frequency power distribution and will not cause instability of the radio-frequency power.

In a more preferred embodiment, as shown in FIG. 1, the electrical connection part 114 includes a transverse portion in the radial direction of the retractable electrically conductive part; moreover, the transverse portion is a rigid connection part, i.e., the transverse portion does not have an adaptive displacement as the retractable electrically conductive part 112 moves.

The processing chamber of the plasma etching apparatus is a hermetically sealed space enclosed by the chamber body 100 and other essential components, such that the wafer may completely undergo the etching process in the vacuum environment of the processing chamber. In the present disclosure, an upper electrode 102 is disposed at the top of the chamber body 100; the upper electrode 102 may be disposed inside the chamber body 100, implementing sealing of the top of the chamber body 100 through other members, such as an upper cover plate; the upper electrode 102 may optionally be inlaid in the top of the chamber body 100. Here, the dispositions of the upper electrode are only exemplary, and the present disclosure has no limitation on disposition of the upper electrode 102 and sealing of the top of the chamber body 100.

In an embodiment of the present disclosure, the chamber body 100 comprises a side wall 1001 and a bottom wall 1002; the lower electrode 105 is disposed above the opening, such that the electrically conductive supporting rod 110 and the retractable electrically conductive part 112 may move up and down at the opening position.

The base 10 further comprises a dielectric ring 132 and an inner electrically conductive ring 136; the dielectric ring 132 is fixed to the outer side of the lower electrode 105; the inner electrically conductive ring 136 is fixed to the outer side of the dielectric ring 132; the outer side of the inner electrically conductive ring 136 is the radio frequency return path at the inner side of the chamber body; the inner electrically guiding ring 136 is fixed to the bottom wall 1002 of the chamber body via the retractable sealing part 140. The retractable sealing part 140 is extended or retracted in the axial direction of the electrically conductive supporting rod 110. In other words, the retractable sealing part 140 has the same retractable direction as the retractable electrically conductive part 112. Besides, the inner electrically guiding ring 136 is connected to the chamber body via an electrically conductive strip 160, such that the inner electrically guiding ring 136 and the chamber body 100 have equivalent potentials. In the present disclosure, the inner electrically conductive ring 136 isolates the lower electrode 105 from the radio frequency field in the radio frequency return path at the outer side of the lower electrode 105; in this way, as the lower electrode 105 moves, the inner electrically conductive ring 136 moves up-down along with the lower electrode 105; during the movement of the lower electrode 105, the effect of radio frequency field of the lower electrode 105 on the radio frequency field of the surrounding radio frequency return path should be avoided, preventing the radio frequency field of the lower electrode from causing instability of the radio frequency loop, so as to maintain stability of the radio frequency loop while achieving adjustability of the plate distance.

In the present disclosure, the upper surface of the lower electrode 105 is hermetically disposed in an accommodation space where the chamber body 100 is accommodated via a retractable sealing part 140; the retractable sealing part 140 is made of a dielectric material, e.g., a bellow seal, i.e., a bellow for the purpose of sealing; here, the upper surface of the lower electrode 105 refers to the surface facing the upper electrode 102. It can be understood that the retractable sealing part 140 can be directly or indirectly fixed with the inner electrically conductive ring 136; when the base 10 further includes other components, the retractable sealing part 140 may cooperate with said other components to implement sealing of the bottom of the chamber body, such that the surface of the lower electrode 105 facing the upper electrode 102 is disposed in the hermetically sealed chamber. In this embodiment, the dielectric ring 132 is fixed to the lower electrode 105, and the inner electrically conductive ring 136 is fixed to the dielectric ring 132 and then fixed, via the retractable sealing part 140, onto the bottom wall 1002 of the chamber body, such that the upper surface of the lower electrode 105 is hermetically disposed in the accommodation space where the chamber body 100 is accommodated; as shown in FIG. 1, the hermetical space in the lower portion of the chamber body 100 is enclosed by the side wall 1001 and the bottom wall 1002 of the lower electrode 105, the inner wall of the retractable sealing part 140, and the side wall of the dielectric ring 132, such that the upper surface of the lower electrode 105 is disposed in the chamber body 100, while the lower surface of the lower electrode 105, the electrically conductive supporting rod 110, and the telescope electrically conductive rod 112 are disposed outside the chamber body 100; a vacuum environment is provided in the chamber body 100 for undergoing of the etching process.

The dielectric ring 132 is made of a dielectric material, e.g., a ceramic material, to electrically isolate the lower electrode 105 from the inner electrically conductive ring 136.

The inner electrically guiding ring 136 is an electrically conductive material; the inner electrically conductive ring 136 is connected to the bottom wall 1002 of the chamber body via an electrically conductive strip 160. The length of the electrically conductive strip 160 is adapted to a movable amount of the retractable sealing part 140; the electrically conductive strip 160 may be a flexible electrically conductive material, e.g., metal copper. The length of the Electrically conductive strip 160 has a certain margin, such that when the retractable sealing part 140 is extended or retracted up or down, a good electrical connection state may be still maintained between the inner electrically conductive ring and the chamber body.

At the outer side of the inner electrically conductive ring 136 exists a radio frequency return path at the inner side of the chamber body; the radio frequency return path is used for the radio frequency power to return; the radio frequency return path may be provided by the side wall 1002 of the chamber body, and may also be provided by other components in the chamber body. In the embodiment, a grounding ring 101 is further provided in the chamber body 100; the grounding ring is an electrically conductive material, which serves as part of the radio frequency return path. The grounding ring 101 is disposed at the outer side of the inner electrically conductive ring 136; a gap is provided between the grounding ring and the inner electrically conductive ring; the inner electrically conductive ring 136 is configured for shielding the radio frequency interference between the lower electrode and the grounding ring 101. The grounding ring 101 and the chamber body 100 form a cavity 103; the cavity 103 may be configured to form an exhaust cavity; a plasma confinement ring 134 may be provided on the cavity 103; the exhaust cavity is formed via the plasma confinement ring 134, the cavity 103, the grounding ring 101, and the chamber body 101 jointly; besides, the plasma confinement ring 134 includes an electrically conductive part. Particularly, the grounding ring 101 is an isolation wall which is electrically conductive. On the one hand, the grounding ring 101 may serve as a radio frequency return path; on the other hand, it transversely isolates out a space for the exhaust cavity; the plasma confinement ring 134 is an air permeated structure, so as to quench the extra plasma inside the chamber body and cause the exhaust gas to enter the exhaust cavity; the exhaust cavity is generally further provided with an air pump, via which the exhaust gas in the chamber is pumped out.

In this embodiment, as shown in FIG. 1, after the radio frequency current passes through the plasma confinement ring 134 from the side wall 1002 of the chamber body, it enters the grounding ring 101; in this way, the return path for the radio frequency current is achieved and effectively shortened by the necessary components such as exhaust cavity in the chamber and the plasma confinement ring. In the specific example, the plasma confinement ring 134 is a laminated structure, comprising a lower electrically conductive part and an upper dielectric material layer from bottom to top; as shown in the dashed line in FIG. 1, the radio frequency current from the side wall 1002 of the chamber body enters the grounding ring 101 in the lower electrically conductive layer of the plasma confinement ring 134.

The grounding ring 101 is connected on the bottom wall 1002; the electrically conductive strip 160 is also disposed on the bottom wall 1002; in this way, as shown by the dashed line in FIG. 1, after passing through the electrically conductive strip 160 from the bottom wall 1002, the radio frequency current sequentially passes through the outer side and the inner side of the inner electrically conductive ring 160 and then returns, from the bottom wall 1002 of the chamber body, to the loop end of the matcher 120.

In addition, an electrostatic chuck 107 is further provided on the lower electrode 105; as shown in FIG. 1, the central region of the lower electrode 105 is higher than the edge region; the central region is for supporting the wafer, which has a shape and a size substantially identical to the wafer; the electrostatic chuck 107 is disposed above the central region; the dielectric ring 132 surrounds the edge region, the edge of the lower electrode 105, and the lower portion region of the lower electrode 105, and extends to the outer side of the retractable sealing part 140.

Moreover, a focus ring 130 surrounding the electrostatic chuck 107 is further provided on the dielectric ring 132; the focus ring 130 is configured for preventing arc discharge. In the specific example, as shown in FIG. 1, the focus ring 105 has a flared oblique face proximate to the upper portion of the inner wall of the electrostatic chuck 107; an outer edge of the focus ring 130 proximal to the electrostatic chuck 107 is a recessed region the recessed region being adaptable for disposing an edge ring 138.

Besides, the electrically conductive supporting rod 110, the retractable electrically conductive part 112, the electrical connection part 114, and the chamber body 100 all have radio frequency radiations, and such a radio frequency shield cover may be provided outside them; based on the connections between them, radio frequency shielding may be implemented by one or more radio frequency shield covers. In this example, as shown in FIG. 1, radiation shielding may be implemented by the radio frequency shield cover (not shown) of the chamber body 100, and the radio frequency shield covers 150 outside the retractable electrically conductive part 112 and the electrical connection part 114.

What have been described above are only preferred embodiments of the present disclosure. Although the present disclosure has been described with preferred embodiments, such preferred embodiments are not intended to limit the present disclosure. Any skilled in the art may make various possible alternations and modifications to the technical solution of the present disclosure using the method and technical content revealed above without departing from the scope of the present disclosure, or modify them as equivalent embodiments. Therefore, any simple alternations, equivalent changes and modifications to the above embodiments based on the substance of the present disclosure without departing from the contents of the technical solution of the present disclosure still fall within the protection scope of the present disclosure.

We claim:

1. A capacitively coupled plasma etching apparatus, comprising:
    a chamber body, which includes a side wall and a bottom wall, the bottom wall having an opening;
    an upper electrode disposed in the chamber body and a base arranged opposite to the upper electrode, the base comprising a lower electrode, the lower electrode being fixed to an electrically conductive supporting rod and disposed above the opening;
    a retractable electrically conductive part fixed to a lower end of the electrically conductive supporting rod, the retractable electrically conductive part being extended or retracted in the axial direction of the electrically conductive supporting rod; and
    an electrical connection part securely connected between the lower end of the retractable electrically conductive part and an output end of a radio frequency matcher, a loop end of the radio frequency matcher being fixed at the bottom of the chamber body, thereby grounding the chamber body;
    wherein the base further comprises a dielectric ring fixed to the outer side of the lower electrode, and an inner electrically conductive ring fixed to the outer side of the dielectric ring;
    a grounding ring forming a radio-frequency return path to the grounded chamber body is provided at the inner side of the chamber body at the outer side of the inner electrically conductive ring, and a gap is provided between the inner electrically conductive ring and the grounding ring, the inner electrically conductive ring is configured for shielding radio frequency interference between the lower electrode and the grounding ring; the inner electrically conductive ring is fixed to the bottom wall of the chamber body via a retractable sealing part made of a dielectric material, such that the upper surface of the lower electrode is disposed in an accommodation space where the chamber body is accommodated; and the retractable seal part is extended or retracted in the axial direction of the electrically conductive supporting rod; and an electrically conductive strip is fixedly connected between the inner electrically conductive ring and the grounded chamber body, the length of the electrically conductive strip being adapted to the movable amount of the retractable sealing part.

2. The apparatus according to claim 1, further comprising a cavity being provided between the grounding ring and the side wall.

3. The apparatus according to claim 2, further comprising a plasma confinement ring disposed above the cavity, the plasma confinement ring and the cavity forming an exhaust cavity; and the plasma confinement ring comprises an electrically conductive part, the electrically conductive part causing the radio frequency current to enter the grounding ring from the side wall of the chamber body through the plasma confinement ring.

4. The apparatus according to claim 2, wherein the electrically conductive strip is fixed to the bottom wall of the chamber body; the radio frequency current from the grounding ring flows through the electrically conductive strip, then sequentially through the outer side and the inner side of the inner electrically conductive ring, and returns to the loop end from the bottom wall of the chamber body.

5. The apparatus according to claim 1, wherein the retractable electrically conductive part is an electrically conductive bellow, the axis of the electrically conductive bellow overlapping with the axis of the electrically conductive supporting rod.

6. The apparatus according to claim 1, wherein the retractable sealing part is a bellow seal.

7. The apparatus according to claim 1, wherein an electrostatic chuck is disposed on the lower electrode, the dielectric ring surrounding the side wall of the lower electrode, and a focus ring surrounding the electrostatic chuck is further provided on the dielectric ring.

8. The apparatus according to claim 1, wherein radio frequency matcher is provided in one or plurality, the plurality of radio frequency matchers having different frequencies and powers.

9. The apparatus according to claim 1, wherein one or more radio frequency shield covers are further provided outside the electrically conductive supporting rod, the retractable electrically conductive part, and the electrical connection part.

10. The apparatus according to claim 1, wherein the electrical connection part comprises a transverse portion in the radial direction of the retractable electrically conductive part, and the transverse part is a rigid connection part.

11. The apparatus according to claim 3, wherein the electrically conductive strip is fixed to the bottom wall of the chamber body; the radio frequency current from the grounding ring flows through the electrically conductive strip, then sequentially through the outer side and the inner side of the inner electrically conductive ring, and returns to the loop end from the bottom wall of the chamber body.

* * * * *